United States Patent
Tedrow

(10) Patent No.: US 9,564,181 B2
(45) Date of Patent: Feb. 7, 2017

(54) MEMORY DEVICE COMPRISING DOUBLE CASCODE SENSE AMPLIFIERS

(71) Applicant: Sony Corporation, Tokyo (JP)

(72) Inventor: Kerry Tedrow, Folsom, CA (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 190 days.

(21) Appl. No.: 14/193,708

(22) Filed: Feb. 28, 2014

(65) Prior Publication Data

US 2015/0071011 A1 Mar. 12, 2015

Related U.S. Application Data

(60) Provisional application No. 61/874,396, filed on Sep. 6, 2013.

(51) Int. Cl.
*G11C 7/06* (2006.01)

(52) U.S. Cl.
CPC ................................. *G11C 7/062* (2013.01)

(58) Field of Classification Search
CPC ..... G11C 7/1006; G11C 7/14; G11C 11/4091; G11C 7/065; G11C 11/41; G11C 11/419; G11C 11/5642
USPC .............................................. 365/189.07, 205
See application file for complete search history.

(56) References Cited

U.S. PATENT DOCUMENTS

| | | | |
|---|---|---|---|
| 6,052,304 A | 4/2000 | Chritz | |
| 6,181,193 B1 | 1/2001 | Coughlin, Jr. | |
| 7,026,843 B1 | 4/2006 | Yang et al. | |
| 7,126,869 B1 * | 10/2006 | Chou ..................... | G11C 7/067 365/203 |
| 7,161,861 B2 * | 1/2007 | Gogl ..................... | G11C 5/145 365/205 |
| 2003/0021148 A1 * | 1/2003 | Scheuerlein ........... | G11C 5/025 365/175 |
| 2004/0120200 A1 * | 6/2004 | Gogl ..................... | G11C 7/067 365/210.1 |
| 2009/0147596 A1 * | 6/2009 | Shiah .................... | G11C 7/065 365/189.11 |
| 2011/0026346 A1 * | 2/2011 | La Rosa ................ | G11C 7/065 365/207 |

OTHER PUBLICATIONS

Double Cascode Sense Amplifier Prior Art Search Report, 16 Pages, Oct. 10, 2013.

* cited by examiner

*Primary Examiner* — Huan Hoang
(74) *Attorney, Agent, or Firm* — Sheridan Ross P.C.

(57) ABSTRACT

A memory device comprising a memory array comprising a plurality of memory cells, a plurality of bitlines and a plurality of wordlines for writing to the plurality of memory cells and a sense amplifier coupled to a first bitline of the plurality of bitlines, for reading the contents of a selected memory cell, the sense amplifier comprising a first cascode transistor pair coupled to a second cascode transistor pair, the first cascode transistor pair coupled to the first bitline and a second bitline, and a current comparator coupled to a drain side of the second cascode transistor pair for determining a value of the selected memory cell.

17 Claims, 1 Drawing Sheet

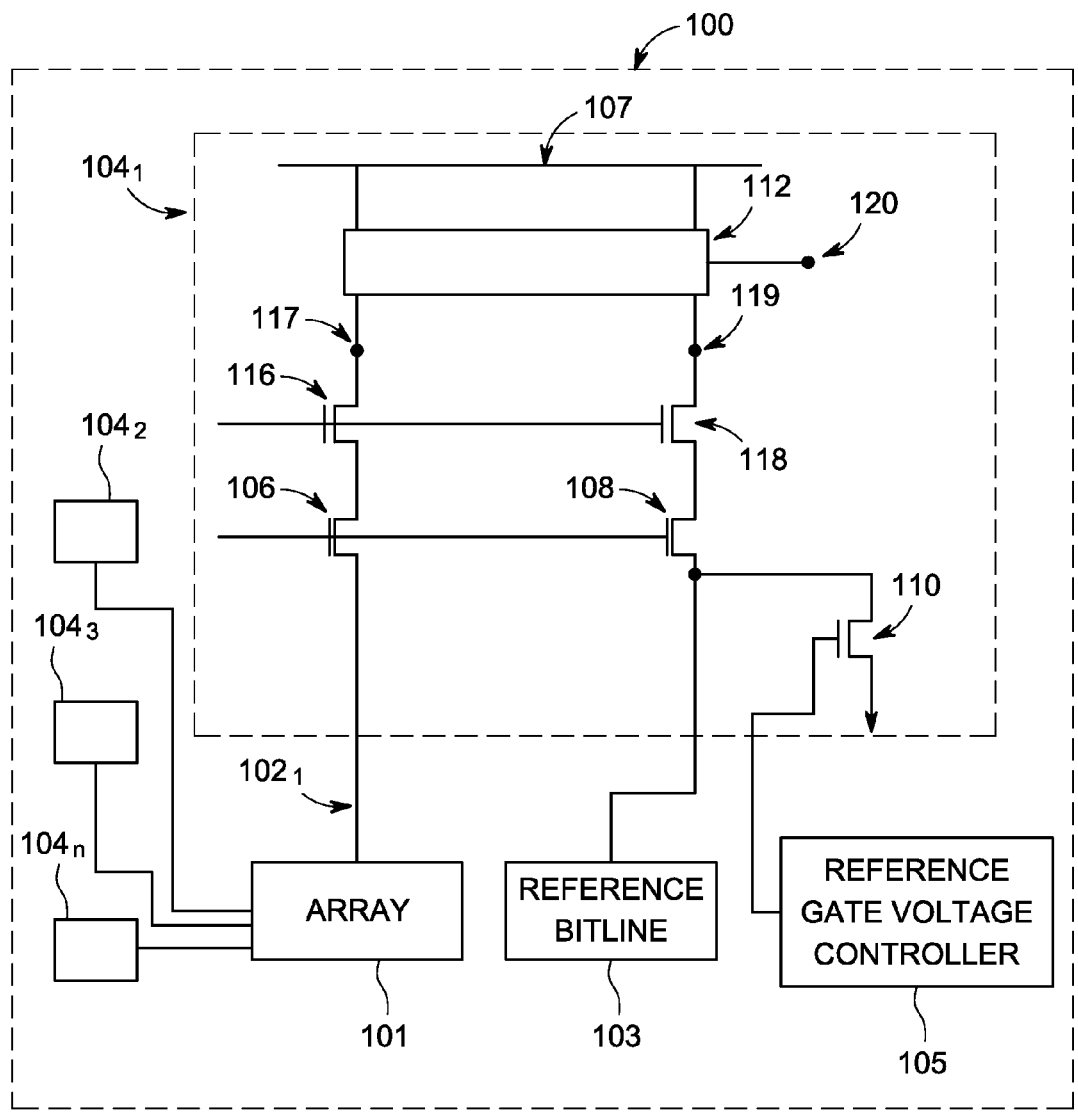

MEMORY DEVICE COMPRISING DOUBLE CASCODE SENSE AMPLIFIERS

CROSS-REFERENCE TO RELATED APPLICATIONS

This application claims the benefit of U.S. Provisional Application No. 61/874,396 filed on Sep. 6, 2013, which is herein incorporated by reference in its entirety.

FIELD

Certain embodiments of the disclosure relate to sense amplifiers in memory devices. More specifically, embodiments of the disclosure relate to a memory device comprising double cascode sense amplifiers.

BACKGROUND

Modern memory devices comprise a memory array with a plurality of memory cells via corresponding column selects, bitlines and wordlines. Various operations can be performed on each individual cell by applying a pulse to the cells via the bitlines, such as a SET pulse, a RESET pulse, or a READ pulse. The READ pulse allows the current value stored in a memory cell to be read. Generally, sense amplifiers are used to perform the READ operation to determine the value of the cell.

For resistive memory, a memory cell can be in a low resistive state (LRS) or a high resistive state (HRS). A sense amplifier is an analog to digital converter that compares a current from the memory cell to a reference current to determine whether a cell is in LRS or HRS. For some memory types, resistive memories in particular, cell current is strongly dependent on the bitline voltage which must be precisely controlled. Conventionally, sense amplifiers are composed of a cascode transistor pair coupled to a reference circuit and coupled to a current mirror, with a comparator to determine whether the current across the current mirror has changed as compared to the reference current. The cascode transistor pair is used to precisely control the voltage of a bitline to sense the memory cell current.

Generally, the cascode transistors which are used in memory devices are thick oxide transistors to support a high voltage power supply (e.g., 5V). However, higher voltages at the bitlines can cause damage to the memory cells in the array and may also increase the time it takes for a bitline to charge. Additionally, thick oxide transistors have poor matching characteristics (e.g., random threshold voltage mismatches) because of their sensitivity to dopant atom fluctuation. Accordingly, it is difficult to use thick oxide transistors as cascode transistors in a sense amplifier.

Therefore, there is a need in the art for a memory device comprising double cascode sense amplifiers.

SUMMARY

A memory device comprising double cascode sense amplifiers is provided, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIG. 1 is a block diagram depicting a memory device in accordance with exemplary embodiments of the present invention.

DETAILED DESCRIPTION

Exemplary embodiments of the present invention are related to a memory device comprising double cascode sense amplifiers. In some embodiments, a memory device is provided, wherein the sense amplifier comprises two pairs of cascode transistors, wherein the second pair of cascode transistors protects the first pair of cascode transistors from a high voltage, the first pair of cascode transistors being coupled to a memory array via a plurality of bitlines. The sense amplifier further comprises a reference circuit and a current comparator. The current comparator compares the bitline current to the reference current and outputs a voltage in accordance with the current difference to indicate the value of the selected memory cell.

FIG. 1 is a block diagram depicting a memory device 100 in accordance with exemplary embodiments of the present invention. The memory device 100 comprises a memory array 101 of memory cells, the memory array 101 coupled to sense amplifiers $104_1$ to $104_n$ via bitlines $102_1$ to $102_n$. An intersection of one of the bitlines and one of the wordlines is a memory cell. Each bitline is used to set the memory to a high resistance state (HRS), reset the memory cell to a low resistance state (LRS) or read the state of memory cell in the memory array 101. Those of ordinary skill in the art will recognize that a HRS is a low current state, and a LRS is a high current state. In order to read the state of the memory cell from memory array 101, the sense amplifiers $104_1$ to $104_n$ are coupled to each column of the memory array 101 via bitlines $102_1$ to $102_n$.

For simplicity, the circuitry for one sense amplifier, $104_1$ is shown. Each sense amplifier $104_1$ to $104_n$ has, according to this embodiment, equivalent circuitry as that shown for sense amplifier $104_1$ to read all memory cells in the memory array 101.

The sense amplifier $104_1$ comprises a first cascode transistor 106, a second cascode transistor 108, a third cascode transistor 116 and a fourth cascode transistor 118. The sense amplifier $104_1$ further comprises a current comparator 112 with a digital output 120. The sense amplifier $104_1$ further comprises a reference transistor 110. The sense amplifier $104_1$ outputs a logic level of a memory cell from the current comparator 112 based on the current across bitline $102_1$ and the reference current across reference transistor 110.

According to an exemplary embodiment, the cascode transistors 106, 108, 116 and 118 are n-type transistors. The voltage of the bitline $102_1$ ($V_{BL}$) is controlled by the first pair of thin oxide cascode transistors, 106 and 108. The voltage applied at the gate of the cascode transistor 106 and the cascode transistor 108, referred to as $V_{G\_CASC}$ (cascode voltage), controls charging of the bitline $102_1$. Current flows through cascode transistor 106, and $V_{BL}$ begins to accumulate on the bitline $102_1$ until an equilibrium point, where $V_{BL}$ is a threshold voltage below $V_{G\_CASC}$. For example, if the threshold voltage ($V_T$) of cascode transistor 106 is equal 500 mv and $V_{G\_CASC}$ is equal to 1.5V, in order for current to flow through transistor 106, $V_{BL}$ is equal to approximately 1 volt.

Thin oxide transistors have a higher transconductance, and, as a result are able to provide more current for charging the bitline at the beginning of a sense operation, leading to reduced charge times and faster current comparator responses due to lower capacitances on nodes 117 and 119. In some exemplary embodiments, $V_{BL}$ is equal to 0.5V, $V_T$=0.5V, $V_{G\_CASC}$=1.0V, ref-current=1 uA, initial BL charging current=200 uA if transistors 106 and 108 are implemented as thin oxide transistors and 100 uA if transistors 106 and 108 are implemented as thick oxide transistors (for an initial BL voltage=0 V). Those of ordinary skill in the art will recognize that these values are merely exemplary and are not meant to limit the present invention in any way.

The third and fourth cascode transistors, transistors 116 and 118, serve as protection for the thin oxide transistors 106 and 108 by controlling the drain voltages of transistors 106 and 108 and restricting the drain voltage from going too high (typically, thin oxide transistors are rated for maximum voltages of 1.3V) and essentially shielding the transistors 106 and 108 from damage. According to this embodiment, the transistors 116 and 118 are thick-oxide transistors which support a 5 volt power supply at their respective drains. The protection voltage ($V_{PROT}$) applied at the gate of the transistors 116 and 118, are set at a level low enough (e.g., 1.8V) to satisfy the thin oxide drain voltage limit, yet high enough to not restrict current during bitline charging.

A reference bitline 103 provides the voltage at the source of the second cascode transistor 108 to match the capacitance of the bitline $102_1$ in order to provide noise rejection. Those of ordinary skill in the art will recognize that the reference bitline 103 is optional. The reference transistor 110 has a reference voltage applied to its gate, the voltage generated via a reference gate voltage controller 105. The reference gate voltage controller 105 generates a current $I_{ref}$ across reference transistor 110. The current across reference transistor 110, $I_{ref}$, is approximately equivalent to the average of the current across a memory cell set to LRS and the current across a memory cell set to HRS.

The current comparator 112 is used to determine the difference in the current in the memory array 101 and the reference current $I_{ref}$. The current comparator 112 outputs a voltage that is dependent on the difference in its input currents; output 120 is a high voltage if current flowing at node 117 (input to the comparator 112 is greater than node 119 (input to the current comparator 112), otherwise output 120 is a low voltage. If the output 120 indicates that the array current is higher than $I_{ref}$, this is indicates that the currently selected memory cell is set to a LRS, otherwise if the array current is lower than $I_{ref}$, the memory cell is set to a HRS. Those of ordinary skill in the art will recognize that the current comparator may be formed using a current mirror coupled to a voltage comparator, resistive elements coupled to a voltage comparator, or the like. Those of ordinary skill in the art will also recognize that the resistive elements can be MOS transistors configured to behave like resistors, or actual resistors (e.g., diffusion resistors or poly-silicon resistors).

The second cascode transistor 108 and the fourth cascode transistor 118 are saturated when $V_{G\_CASC}$ is applied to their respective gates. Once the reference current $I_{ref}$ is generated by the reference circuit, $I_{ref}$ flows through the second cascode transistor 108 and the fourth cascode transistor 118.

If a memory cell is set to LRS, the array current is greater than the reference current. Consequently, the voltage and current at node 117 decrease as compared to the voltage and current at node 119, so the current comparator 112 outputs a high value at output 120. If a memory cell is set to HRS, the current of memory array 101 decreases. Consequently, the voltage and current at node 117 increases as compared to the voltage and current at node 119, so the comparator 112 outputs a low value at the output 120. Accordingly, the resistance value of a particular memory cell can be determined by reading the output value at output 120 of the current comparator 112 using the sense amplifier $104_1$.

Generally, thick oxide transistors, e.g., third cascode transistor 116 and fourth cascode transistor 118, can be exposed to high voltages without damage. The node 117 can, for example, go to a high voltage (for example, 5V) when a cell at HRS is read. A thin oxide transistor is unable to handle a high voltage (e.g., above 1.3V) without oxide break down. Accordingly, the first cascode transistor 106 and the second cascode transistor 108 are embodied as thin oxide transistors shielded from high voltages by the cascode transistors 116 and 118. During the fabrication process of thin oxide transistors, the amount of dopant atoms in each transistor differs slightly, contributing to better matching characteristics, such as lower difference between threshold voltages than that of thick oxide transistors. This makes it desirable to use in controlling the bitline voltage.

The double cascode arrangement of cascode transistors 116 and 118 coupled at the drain of the cascode transistors 106 and 108 also results in the reduction of drain capacitance presented to the current comparator 112. The current comparator 112 can more quickly sense the difference at nodes 117 and 119 because of the capacitance reduction than with a single cascode arrangement. According to exemplary embodiments, the capacitance at node 117 and 119 originates from the current comparator 112 by 40%, the cascode transistors 116 and 118 by 40% and the comparator by 20%.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A memory device comprising:
    a memory array comprising a plurality of memory cells;
    a plurality of bitlines and a plurality of wordlines for writing to the plurality of memory cells; and
    a sense amplifier coupled to a first bitline of the plurality of bitlines, for reading the contents of a selected memory cell, the sense amplifier comprising:
        a first cascode transistor pair coupled to a second cascode transistor pair, the first cascode transistor pair coupled to the first bitline and a reference bitline, wherein the first cascode transistor pair includes:
            a first cascode transistor having a source that is coupled to the first bitline to set a bitline voltage, and
            a second cascode transistor having a source that is coupled to a reference bitline and a reference transistor,
        wherein the second cascode transistor pair includes:
            a third cascode transistor having a source that is coupled to a drain of the first cascode transistor; and
            a fourth cascode transistor having a source that is coupled to a drain of the second cascode transistor, wherein the first and second cascode transistors are thin oxide transistors, and wherein the third and fourth cascode transistors are thick oxide transistors; and a current comparator coupled to a drain side of the second cascode transistor pair for determining a value of the selected memory cell, wherein a drain of the third cascode transistor is coupled to a first node of the current comparator, and wherein a drain of the fourth cascode transistor is coupled to a second node of the current comparator.

2. The memory device of claim 1, the current comparator comprising one of a current mirror coupled to a voltage comparator or resistive elements coupled to a voltage comparator.

3. The memory device of claim 2, wherein the current comparator comprises resistive elements, and wherein the resistive elements are transistors configured to behave like resistors, diffusion resistors or poly-silicon resistors.

4. The memory device of claim 3, wherein the transistors of the resistive elements are MOS transistors.

5. The memory device of claim 1, wherein a gate of the reference transistor is coupled to a reference gate voltage controller which generates a current across the reference transistor equal to the average of the current across a memory cell in low resistance state and a current across a memory cell in high resistance state.

6. The memory device of claim 1, wherein the first and second cascode transistor pairs comprise n-type transistors.

7. The memory device of claim 1, wherein a cascode voltage is applied to the gate of the first cascode transistor pair to control the voltage of the first bitline.

8. The memory device of claim 1, wherein a protection voltage is applied to the gates of the second cascode transistor pair to control voltage at the drain of the first cascode transistor pair.

9. The memory device of claim 1, wherein a capacitance of the first bitline is matched to a capacitance of the reference bitline.

10. A memory device comprising:
a memory array; and
one or more sense amplifiers, each comprising:
 a first cascode transistor pair for the memory array, wherein the first cascode transistor pair includes a first cascode transistor and a second cascode transistor, and wherein the first and second cascode transistors are thin oxide transistors;
 a second cascode transistor pair for the first cascode transistor pair, wherein the second cascode transistor pair includes a third cascode transistor and a fourth cascode transistor, and wherein the third and fourth cascode transistors are thick oxide transistors; and
 a current comparator for comparing current of the memory array to a reference current and for outputting a digital output based on the value of a memory cell in a memory array,
 wherein a source of the first cascode transistor is coupled to a first bitline of the memory array,
 wherein a source of the second cascode transistor is coupled to a reference bitline,
 wherein a drain of the first cascode transistor is coupled to a source of the third cascode transistor,
 wherein a drain of the second cascode transistor is coupled to a source of the fourth cascode transistor,
 wherein a drain of the third cascode transistor is coupled to a first node of the current comparator, and
 wherein a drain of the fourth cascode transistor is coupled to a second node of the current comparator.

11. The memory device of claim 10, the one or more sense amplifiers each further comprising:
a reference circuit for generating the reference current.

12. The memory device of claim 11, wherein the memory device is a resistive RAM device.

13. The memory device of claim 12, wherein the reference current is an average of a current across a memory cell in low resistance state (LRS) and a current across a memory cell in high resistance state (HRS).

14. The memory device of claim 13, the reference circuit further comprising:
a reference transistor coupled at the drain to the source of a transistor of the first cascode transistor pair; and
a reference voltage coupled to a gate of the reference transistor for generating the reference current across the reference transistor.

15. The memory device of claim 10, further comprising:
a plurality of bitlines coupled to the memory array; and
a plurality of wordlines coupled to the memory array,
wherein an intersection of one of the bitlines and one of the wordlines is a memory cell, and the first cascode transistor pair in each sense amplifier is coupled to a bitline.

16. The memory device of claim 10, wherein a voltage applied to gates of the second cascode transistor pair is selected to satisfy a voltage limit of the drain of the thin oxide transistors and to enable charging of a bitline coupled to the sense amplifier.

17. The memory device of claim 10, wherein a capacitance of the first bitline is matched to a capacitance of the reference bitline.

* * * * *